(12) United States Patent
Abbott et al.

(10) Patent No.: US 6,337,445 B1
(45) Date of Patent: Jan. 8, 2002

(54) COMPOSITE CONNECTION STRUCTURE AND METHOD OF MANUFACTURING

(75) Inventors: Donald C. Abbott, Norton, MA (US); Douglas W. Romm, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/270,184

(22) Filed: Mar. 12, 1999

Related U.S. Application Data (60) Provisional application No. 60/078,056, filed on Mar. 16, 1998.

(51) Int. Cl.[7] ............................. H05K 1/16; H05K 7/10
(52) U.S. Cl. .................. 174/260; 361/768; 228/180.22; 174/257
(58) Field of Search ................................ 174/260, 257; 361/768, 770, 771; 257/748, 737, 738, 780; 228/180.22

(56) References Cited

U.S. PATENT DOCUMENTS

| | | | | |
|---|---|---|---|---|
| 5,431,328 A | * | 7/1995 | Chang et al. | 228/180.22 |
| 5,868,304 A | * | 2/1999 | Brofman et al. | 228/254 |
| 5,956,235 A | * | 9/1999 | Kresge et al. | 361/774 |

* cited by examiner

*Primary Examiner*—Kamand Cuneo
(74) *Attorney, Agent, or Firm*—Gary C. Honeycutt; Fred Telecky; Arthur I. Navarro

(57) ABSTRACT

A bump connection structure and a method of attachment to integrated circuits or packages is provided which comprises a prefabricated core structure coated with solderable metal layers to form a composite bump. Said composite bump is aligned to contact pads of the chip or package which have been coated with solder paste, and the assembly heated to form a metallurgical bond. The prefabricated core structures are comprised of metal, plastic or ceramic of the size and dictated by package standards. The connection structure is preferably lead free.

24 Claims, 6 Drawing Sheets

| EXAMPLE | CSP TYPE |
|---|---|
| | FLEX CIRCUIT INTERPOSER |
| | RIGID SUBSTRATE INTERPOSER |
| | TRANSFER MOLDED |
| | CUSTOM LEAD FRAME |
| | WATER-LEVEL ASSEMBLY |
| | TCP LEAD FRAME |

COMPOSITE CONNECTION STRUCTURE AND METHOD OF MANUFACTURING

This Application claims priority under 35 USC 119 of Provisional Application Number 60/078,056 filed Mar. 16, 1998.

This invention relates generally to the field of integrated circuit interconnections, and more particularly to a bumped connection structure used on integrated circuits, and on other assemblies, such as integrated circuit packages.

BRIEF DESCRIPTION OF PRIOR ART

A number of forces have influenced the selection o structures which provide connection of an integrateded circuit to the next level of interconnection. Lead density has been a major factor in focusing designers toward connections which are contained within the area of the integrated circuit or of first level packaging, such as flip-chip, ball grid array (BGA) and chip size packages (CSP). These interconnections are generally referred to as area array interconnections and are formed by a bump type of structure as opposed to a flexible lead type of structure which extends out from the perimeter of the integrated circuit element.

Connections for these assemblies are designed as a finely pitched matrix of conductive contacts on the surface with a corresponding matrix of contact pads on the next level of interconnection. Typically the connecting structures have included solder balls or bumps of various lead (Pb) and tin (Sn)compositions, which are reflowed to form the electrical and mechanical connection.

Flip-chip is the oldest of these technologies wherein the input/output contact pads on the surface of the integrated circuit device are soldered directly to the corresponding contact pads of a substrate. The original flip-chip concept employed small solder coated copper balls sandwiched between the chip termination lands and the contact pads of the ceramic substrate. Owing to manufacturing difficulty in handling and placement of the balls, this procedure was replaced by forming solder connection structures or bumps on the chip terminals while still in wafer form. This consisted of depositing thin films of metal on the wafer and patterning the contact pads by photolithography and etch processing and forming bumps on said contact pads by evaporating solder through apertures in metal masks. The wafers were diced, the chips aligned to the substrate and solder reflowed. Owing to the short, rigid connecting structures, fatigue at the solder joints is a concern. Waste treatment for clean-up of lead containing solder from said metal masks is both expensive and a growing environmental issue. Alternately, solder bumps and/or solder over copper bumps have been formed on the contact pads by combinations of sputtered and electroplating.

More recently, techniques have been described for forming flip-chip connecting structures by capturing prefabricated spheres of solder in a matrix of tacky areas defined by photosensitive polymers, aligning the matrix which corresponds to the contact pads on the chips in wafer form and releasing by reflowing the solder.

Flip-chip interconnections have continued to evolve because the technology provides advantages for maximum lead density, and very low inductance. However, the connecting structures have been largely restricted to the use of lead/tin solders of different compositions which are subject to fatigue failures as a function of thermally induced stresses. Further, lead (Pb) containing solders on the surface of soft error sensitive devices has caused concern due to alpha particle emission from lead (Pb), as well as environmental issues with the use of lead (Pb).

Ball grid array (BGA) packages have gained acceptance as low cost, high yielding packages which offer the maximum in board space efficiency as a result of direct connections under the package to the printed wiring board. Both plastic and ceramic BGA packages have been commercialized. Connections between the integrated circuit and the top surface of the BGA package can be by wire bonding or by flip-chip connection. The connecting structures on the bottom surface of the BGA package are typically solder bumps configured in an area array. Typically the structures are formed by partially reflowing eutectic or other lead/tin solders to metal contact pads on the package and these in turn are attached to the printed wiring board by reflow using a solder paste which has been screened onto contact pads on the board. Inspection of the joints has been a concern for BGA packages assembled to boards. The reliability concerns are somewhat similar to those for flip-chip in that thermally induced stresses in the solder joints result from mismatches CTE and Young's modulus and which may vary within the package and board area due to the large size and underlying construction. In addition, stand-off height must be controlled, both to minimize stresses on the solder joints and to allow cleaning. Package weight can contribute to the difficulty in controlling stand off distance of solder bumped packages.

Chip scale (CSP) packaging provides the minimum size at no more than 1.2 times that of the integrated circuit, and is a directly surface mountable package which facilitates testing and ease of handling. There are a number of package styles available, both with leads and bump connection structures. The bumped structures, typically Sn/Pb solder bumps are attached by reflow of prefabricated spheres onto a contact pad on the CSP. As with BGA and flip-chip, the presence of leaded compounds presents an environmental issue to some users. And in particular, thermal mismatch must be compensated in order to avoid solder fatigue failures because the package is dominated by rigid, low CTE silicon in close proximity to a printed wiring board. Cleanup of fluxes presents reliability concerns with the small stand-off height of CSP.

For some specific applications where assembly temperature is restricted by the circuit being assembled, such as liquid crystal displays, raised polymeric structures have been formed on contact pads. The exposed surface of the structure is coated with a metallic film, and attached to the corresponding pads by solder reflow or by conducting adhesive materials. This process of fabricating polymeric bumps is extremely expensive, is limited by processing capabilities and in some cases will not be compatible with thermal testing routinely required of integrated circuits.

Similarly, composite bump structures of metal bumps with tin or other metallic coatings have been formed on wafers or on polymeric flex films for tape automated bonding (TAB) connections. The fabrication process is not unlike that described above for polymeric bumps and is expensive.

SUMMARY OF THE INVENTION

The primary object of this present invention is to provide an integrated circuit, or circuit assemblies with bump connections which allow attachment to the next level of interconnection by using prefabricated structures coated with solder-compatible metals, and which are attached to the circuit or circuit package by solder. The integrated circuit structures compatible with the present invention are those which employ bump or ball connections typical of area array assembly, namely but not limited to ball grid array packages, flip-chip assembly and chip scale packages.

The composite bump structures comprise two or more thin films of solder compatible metal or metals coated onto a prefabricated structure and connecting said structure to the contact pads of an integrated circuit element by solder. The prefabricated core element is comprised of metal, ceramic or polymer and is of the approximate size and uniformity as specified by the integrated circuit element. The connecting structure will be compatible with known manufacturing techniques for attachment to the next level of interconnection. This device provides an economical and reliable connection and does not have the disadvantages of devices assembled by the techniques described above.

Another object of the invention is to provide a solderable composite prefabricated connecting structure whose thermal coefficients of expansion and Young's modulus are selected to improve reliability.

Still another object of the invention is to provide a solderable composite prefabricated bump structure whose thermal conductivity is optimized to improve performance and reliability of the circuit.

Further, it is an object of the invention is to provide a solderable composite prefabricated connecting structure which provides controlled separation distance or stand-off height between the integrated circuit element and the next level of interconnection.

Another object of the invention is to provide a solderable composite prefabricated connecting structure whose shape is selected to improve reliability.

Another object of the invention is to provide an integrated circuit connection structure with metallurgical composition of the coated metal layers whose surface is optimized for compatibility with solders, and the underlying layers of sufficient thickness to provide electrical contact.

Yet another object of the invention is to provide an integrated circuit connection structure whereby the attachment temperature to contact pads of one element is significantly different from the attachment temperature at the corresponding pads of the next surface. This feature facilitates ease of rework.

Another object of the invention is to provide an integrated circuit connection of solderable composite prefabricated bumps which is lead (Pb) free, and uses reliable solder attachment techniques which are commercially available.

Another object of the invention is to provide a solderable composite connecting structure which is lower in alpha particle emission than lead (Pb) bearing solders.

Yet another object of the invention is to provide a solderable composite connection structure which is amenable to inspection by x-ray.

A further object of the invention is to provide an integrated circuit element which weighs less than said elements constructed with lead (Pb) bearing connections.

In accordance with the present invention, there is provided a flexible method of forming the mechanical and electrical connection between an integrated circuit element and connecting structure. This technique is applicable to integrated circuit elements such as BGA, flip-chip, CSP, or other assemblies which make use of bump connection structures. The method described provides for using materials which are optimized to the type of integrated circuit element being assembled; i.e. BGA, flip-chip, or CSP. Further, the invention comprises a method to transfer composite bump structures to the integrated circuit contact pads and is also applicable to each of said package types. Contact pads of said elements are coated with solder paste through apertures in a stencil and composite bumps aligned, brought into contact and the assembly heated to form a metallurgical bond. The transfer method comprises forming an array of patterned areas which register to the location of contact pads. One bump is captured per pattern area and retained until the bumps are aligned to the receiving pads. The preferred method for forming the patterned arrays provides a photoimagable adhesive coated on a transparent carrier film. Upon heating the adhesive loses tackiness and the bumps are transferred to the contact pads with solder paste. Heating is accomplished by infrared, convection or many other techniques commercially available solder reflow processes, and preferably is by radiation heating of the substrate. Equipment designed for aligning, contacting and heating has been disclosed previously in a related disclosures from Texas. Instruments, Inc. in Docket No. TI 26059P and TI-23158P and these are incorporated herein by reference. Further, a suitable film with photosensitive adhesive to form tacky patterned areas is available from E.I. duPont de Nemours & Company. U.S. Pat. No. 5,356,751 is incorporated herein by reference. The integrated circuit or package with connecting structure is used in conjunction with directly soldering said structure to the next level interconnection.

Other objects and advantages of the present invention will become apparent from the following descriptions, taken in connection with the accompanying drawings, wherein, by way of illustration and example, an embodiment of the present invention is disclosed.

An integrated circuit or package with bumped composite connection structure and methods of forming the said structure comprising: a prefabricated core structure of composition, size and shape to support the design requirements of said integrated circuit or package, a coating layer of metal or metals which are electrically conductive and compatible with solder, and solder reflow connection of said structure to the integrated circuit or package.

Said coating metal(s) will be of composition and sufficient thickness for the connecting structure to provide electrical contact between the integrated circuit or package and the next level of interconnection. The coating will be metallurgically compatible with solders. Further, said coating will be adhered to and completely surround the core structure.

Composition of said prefabricated core will be optimized to meet the requirements of the integrated circuit or package type; i.e., a metal core for maximum thermal dissipation, whereas a polymeric or ceramic core material will be optimized for thermal-mechanical requirements by plastic or ceramic substrates. Said connecting structure is preferably free of lead (Pb) containing materials.

A method of forming a connection structure on an integrated circuit or package comprising the steps of providing a prefabricated bump structure designed with conductive, solderable metal layers completely surrounding a core structure, and providing a solder attachment, preferably lead (Pb) free to the integrated circuit or package. Techniques for alignment and attachment of the composite bump structure are compatible with existing manufacturing techniques and the preferred method is based on previously and referenced disclosures.

The drawings constitute a part of this specification and include exemplary embodiments to the invention which may be embodied in various forms.

TABLE 1 Metal Coatings for Composite Bump Structures

DETAILED DESCRIPTION OF PREFERRED EMBODIMENT

Figure 1A:
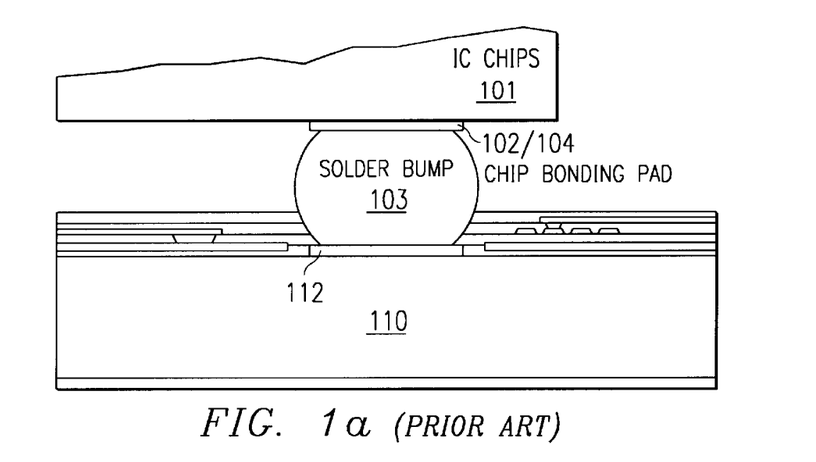
FIG. 1a demonstrates an example of a flip-chip connection as disclosed in prior art.
Figure 1B:
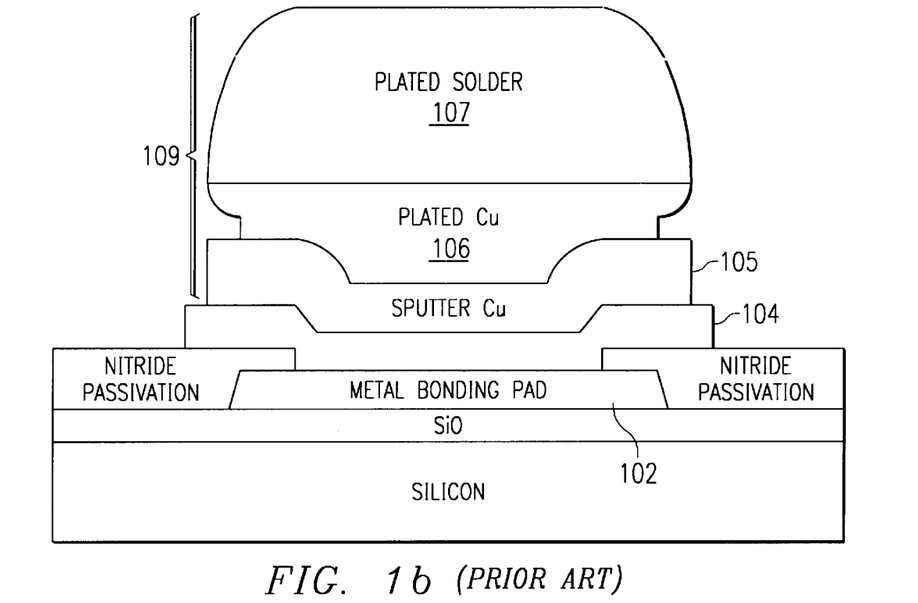
FIG. 1b details flip-chip bump construction (prior art).

Turning now to the drawings, in FIG. 1a there is shown an example of a flip-chip connection structure as disclosed in prior art which includes an integrated circuit 101, with contact pads 102, and a solder bump connecting structure 103. The solder bump is further connected to a substrate 110 with contact pads 112. FIG. 1b depicts in greater detail the composition of a given flip-chip bump structure 109. In this construction, bump structures are fabricated on the input/output contact pads 102 of all chips on an integrated circuit wafer (which is not shown). Said structures are fabricated by a series of metal deposition steps which include sputtering and patterning the under bump (UBM) metallization 104 which protects the thin film aluminum bond pad 102. This is followed by sputtering a seed layer of copper 105 which will be used as the contact electrode for electroplating thicker layers of copper 106 and solder 107 which in turn form the bulk of the bump structure 109. A photoresist (not shown) defines the pattern to be plated. After removal of the photoresist, the excess copper seed layer 105 is removed by an etching process. Another fabrication technique similarly provides the under bump metallization 104, and the bump structure 103 is formed by evaporating solder through apertures in a metal mask.

Flip-chip bump 103 structures are typically 125 microns in diameter by 50–75 microns in height. The allowable diameter of said bumps is determined by size and spacing of the bonding pads of the integrated circuit. Height of electroplated flip-chip structures, such as that given in FIG. 1b are limited by the area to height aspect ratio of the photoresist pattern. Height of the evaporated solder bump will be limited by thickness and apertures of the mask, and by the expense of the process.

Figure 2:
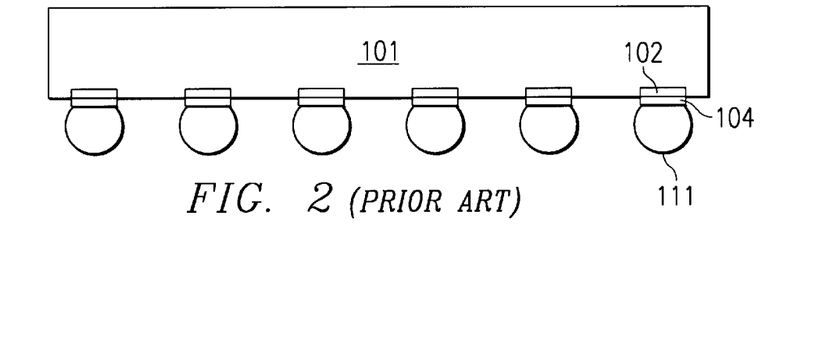
FIG. 2 shows a flip-chip bump assembled from fabricated solder balls.

FIG. 2 illustrates a flip-chip device wherein a prefabricated solder ball 111 is attached to the under bump metallurgy 104 of an integrated circuit contact pad 102. Bump height is not constrained by the fabrication process as it was for those examples wherein the bump was fabricated in situ. Instead, the bump height is controlled by the size of the ball coupled with the flow of solder. Solder flow, in turn, is determined by the size of the pad, the reflow properties of the solder and the reflow process.

Figure 3:
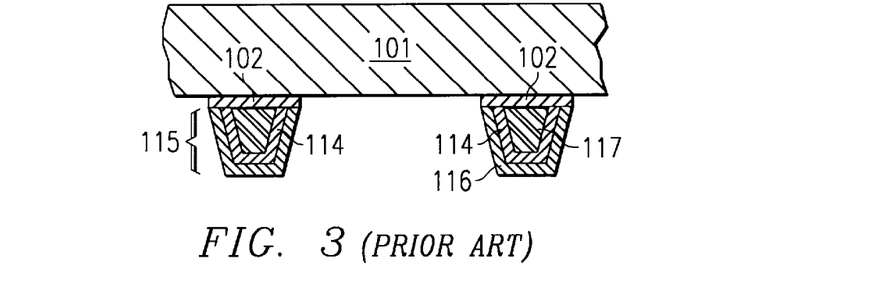
FIG. 3 illustrates a composite bump construction as disclosed in prior art.

FIG. 3 depicts a composite bump structure 115 with metal coatings 114/116 over a polymer core 117. This structure was fabricated by depositing a polymer layer on an integrated circuit wafer (not shown) and patterning to form a bump structure on each input/output pads. The polymer structure fabrication, as described, is accomplished by photopatterning the polymer and chemically etching. The first metal layer 114 must adhere to the polymer, and a subsequent layer 116 is either solder or other metal. These layers are deposited, patterned and the excess removed. Further, all metal layers 116 must be compatible with the bond pad metallization 102 with which they are in direct contact to make electrical connection. The pad area 102 defines the diameter of the bump and the bump height is limited by the patterned area, as well as the polymer process capability.

While the intent of a polymeric structure with low Young's modulus to minimize stress on the solder joints is well founded, this structure is of very limited practical value because of high cost and processing constraints which severely restrict bump height.

Figure 4A:
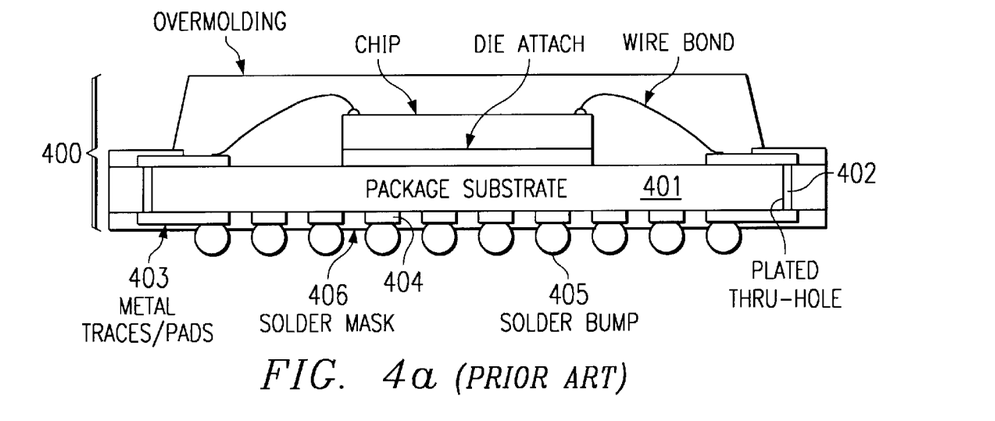
FIG. 4a shows an example of a Plastic Ball Grid Array connecting structure.

Turning now to ball grid array packages, FIG. 4a shows a cross section of a typical plastic ball grid array package 400. We are not concerned with the body of the package and the integrated circuit itself, but rather with the substrate surface which faces the printed wiring board and the connecting structures thereon. The substrate 401 is a plastic laminate which may have multiple layers, not unlike the construction of printed wiring boards with vias 402 and copper traces 403 providing the routing to an array of metal pads 404 on the bottom surface of the package. Solder balls 405 are aligned to and brought into contact with the pads before partially reflowed onto said pads to form the ball or bump connecting structures. Solder composition is typically 63% tin /37% lead or modified with 2% silver added. Said solder balls are typically about 25 mm in diameter; the diameter is controlled by an organic solder mask 406 on the surface which prevents shorting between traces and outputs.

Figure 4B:
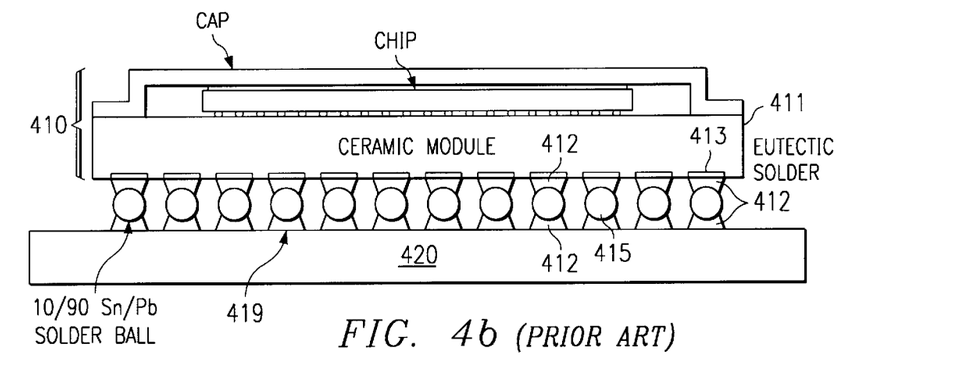
FIG. 4b shows an example of a Ceramic Ball Grid Array.

FIG. 4b depicts a ceramic ball grid array package 410 attached to the next level of interconnection 420. A multilayer ceramic substrate provides an array of contact pads 413 which typically have a layer of nickel with gold to which solder balls are attached by first screening a eutectic solder paste 412 on the pads, aligning and placing prefabricated solder balls 415, which have a higher melt temperature, such as 10Sn/90Pb. The eutectic solder 412 is reflowed and provides attachment for the solder balls. A similar procedure is used to attach the solder balls to the contact pads 419 of the substrate. The high liquidus temperature of the solder ball does not allow them to flow at processing temperatures for eutectic solder and thus the solder balls provide a fixed stand off height. This method of forming connecting structures has also been used for plastic ball grid array packages.

Many variations of ball grid array packages have been developed. The issues with the rigid bump connection structure have consistently been solder fatigue and potential cracking as a result of thermal mismatches between the package and next level of interconnection, inability to inspect hidden joints, stand-off distance between the elements which involves both ability to clean and to minimize stresses, as well as a growing environmental concern for the lead (Pb) content of said packages. These concerns will intensify as packages become larger and the number of input/output connections increase.

Figure 5A:
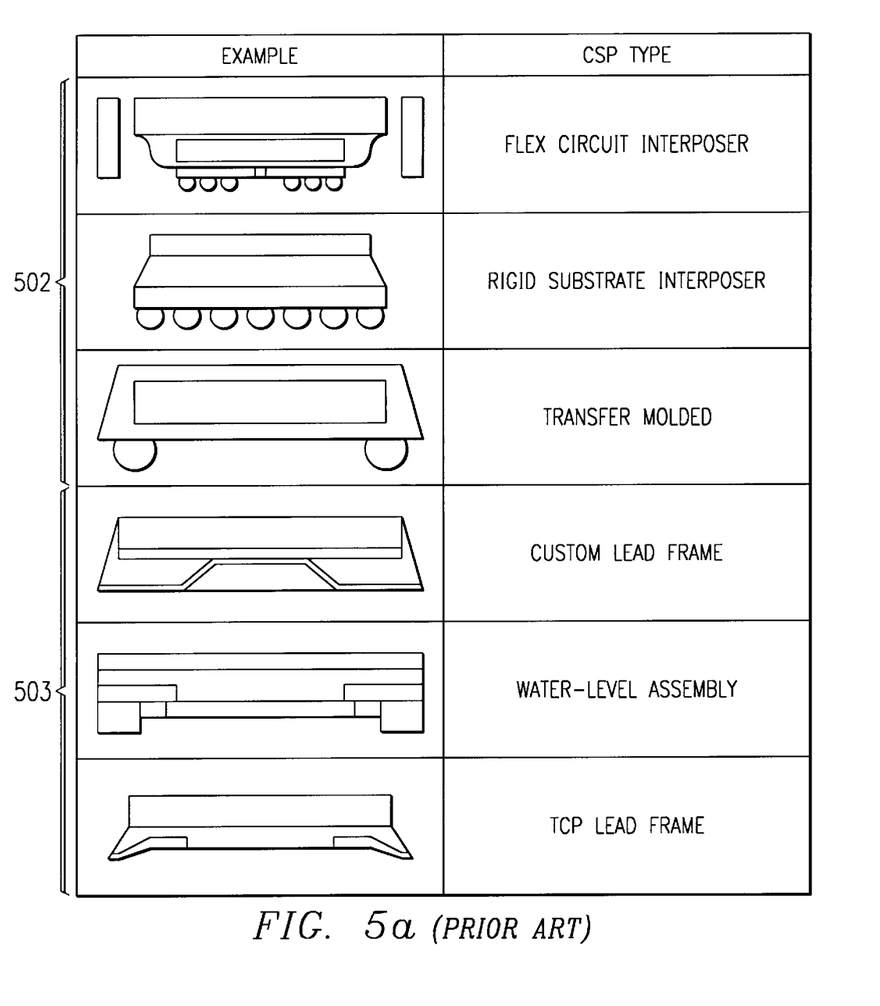
FIG. 5a illustrates some design options of Chip Scale Packages.
Figure 5B:
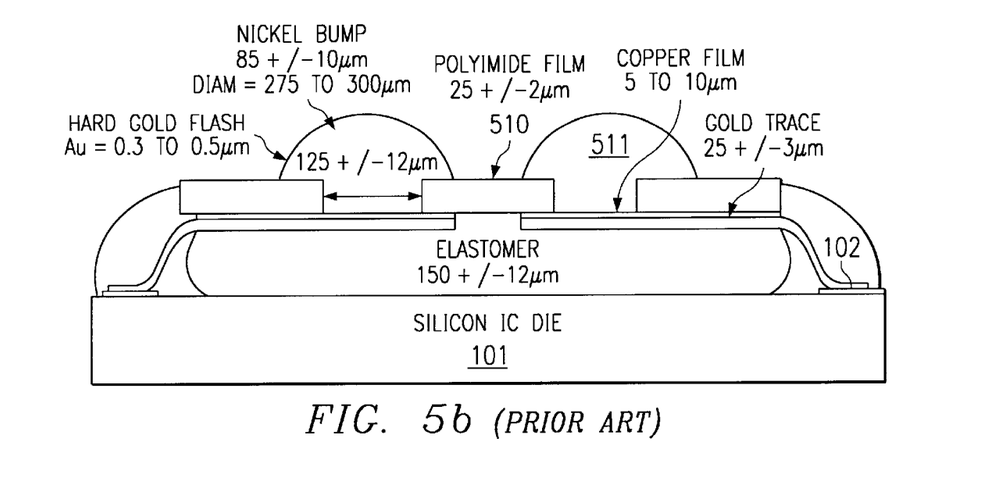
FIG. 5b is a cross sectional sketch of a Chip Scale Package.

Bumped connection structures are also used for some chip scale (CSP) package designs as illustrated in FIG. 5a. Some examples of packages with bump connections 502 are shown along with packages with leads 503. FIG. 5b provides more detail on the construction of one CSP with a flexible circuit interposer. The silicon die 101 provides the CSP outline, its contact pads 102 are connected to compliant leads 510 are constructed on a polyimide film, with Cu and Au traces to form the interconnection. This design has been offered both with composite bumps 511 of gold coated, nickel bumps plated onto the flexible lead fingers or with prefabricated eutectic solder bumps reflowed onto the lead fingers. Cost and accuracy of fabricating the plated structures are issues.

The bumped connection structures present many of the same problems as those of BGA and flip-chip. Thermally induced stress on the solder joints are potentially decreased as a result of the smaller overall size and distance from the neutral point, but the construction materials are often more dissimilar in coefficient of thermal expansion (CTE) and Young's modulus, as is the case with silicon to printed wiring boards. In addition, the contact area and ball sizes are smaller and as a result less tolerant to cracks.

Figure 6A:
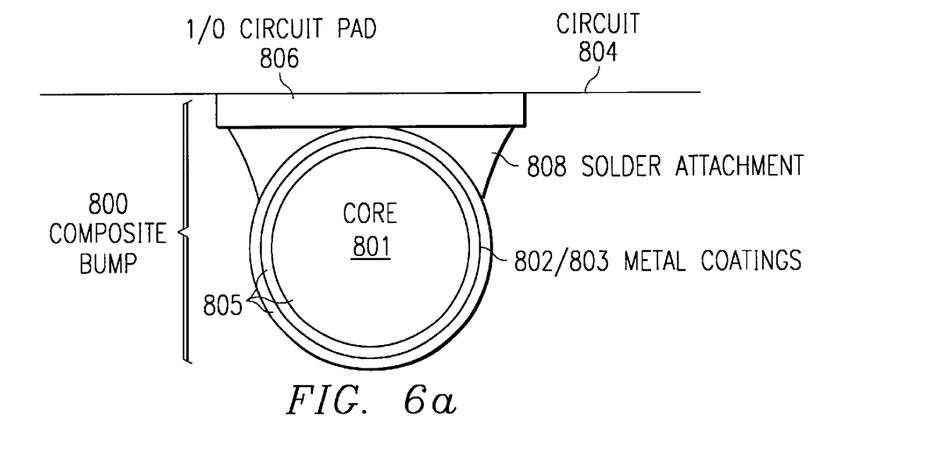
FIG. 6 depicts the present invention; a composite bump structure soldered to an integrated circuit element.

FIG. 6 depicts the connection structure 800 of this invention, which comprises a composite bump 805 attached electrically and mechanically to the integrated circuit or package by solder 808. Said composite bump 805 comprises a prefabricated core 801 of the size warranted for the desired application, coated with metals layers 802/803 which are optimized for compatibility with solders and which provide electrical contact via the solder attachment 808 to the input/output pads 806 of an integrated circuit element 804. Solderability or solder compatibility will be used to imply the ability to achieve a clean metallic surface so that good wetting of molten solder can be formed.

The bump connection structure 800 of this invention is applicable to a ball grid array package, similar in form and function to those shown in FIGS. 4a and 4b, a flip-chip assembly such as shown in FIG. 2 or a chip scale assembly generically depicted as that in FIG. 5b. The application, further is to fully assembled packages with integrated circuits or to substrates for packages prior to assembly. Bump connection structures for these devices have many similarities, but have significantly different size and material requirements because of the variations in composition of the integrated circuit or package and next level interconnection construction. To explain further, bump sizes for flip-chip assembly are determined by the design size and proximity of contact pads on the integrated circuit, but it is preferable to make the bump height as tall as possible. The range of bump size for flip-chip assemblies is typically from 50 to 200 microns. Chip-scale packages have larger bump structures, but a wide range in sizes is specified because of the package form factor variations and lack of standards. The range of bump sizes for chip-scale packages is typically 150 to 400 microns. Ball grid array packages have even larger bump sizes and again some variation is allowed because of different types of packages. Standards exist for different pad pitches, at 1.0, 1.27 and 1.5 mm and bump sizes which range from 0.4 to 1.0 mm diameter are specified.

Figure 6B:
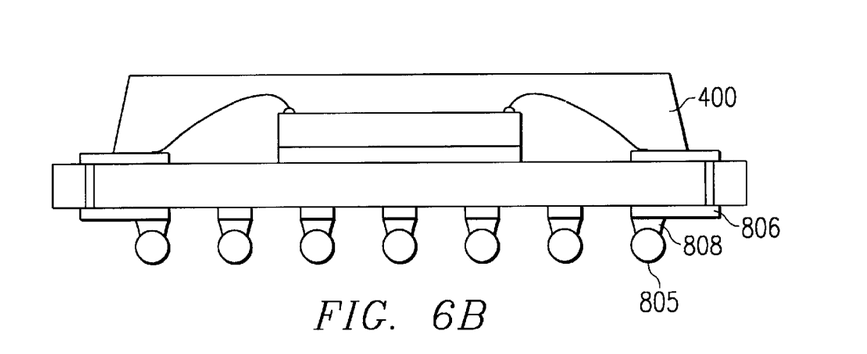
FIG. 6b illustrates the present invention as applied to a Ball Grid Array Package.

For illustration, a preferred embodiment of this invention, a ball grid array package, as depicted in FIG. 6b is provided.

Figure 7:
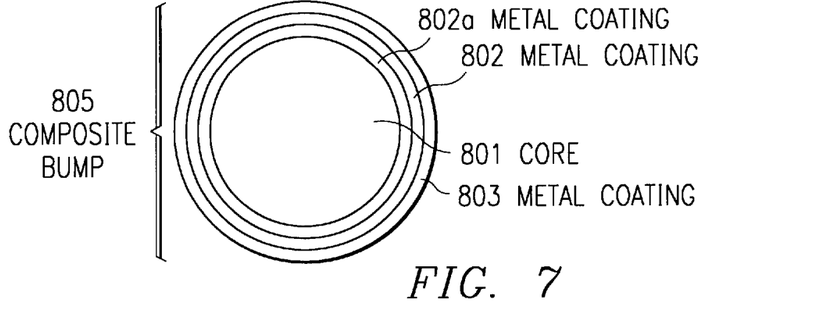
FIG. 7 shows a cross sectional view of a composite ball structure of this invention.
Figure 9:
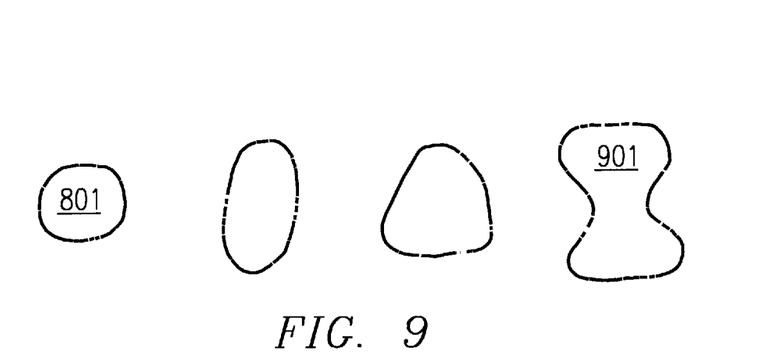
FIG. 9 illustrates alternate prefabricated core shapes.

To explain further, FIG. 7 provides a cross-sectional view of the composite bump structure 805. It should be noted that the terms "bump" or "ball" is used throughout the description of this invention to refer to a finite body of material. It may have the connotation of approximately spherical shape, but is in no way limited and for example, a spheres 801 and other shapes are illustrated in FIG. 9. Said bump is of the appropriate size and uniformity to meet the specifications for connection structures of the integrated circuit or package to which it will be attached. Prefabricated core structures are readily available as either metal, ceramic of high glass transition temperature polymers. In addition, the core structure may be solid, hollow or porous.

In the preferred embodiment, said core structure 801 is a sphere of about 0.9 mm diameter. A metal core, such as copper provides both very good thermal conductivity to help dissipate heat from the integrated circuit element into the next level interconnect and is capable of providing electrical contact. A number of other metals such as Ni, Al or FeNi alloys also provide suitable properties and are readily available.

Alternately, a polymeric core such as polyimide, polyether, or polysulfone provides a better match in Young's modulus and thermal expansion coefficients to the polymeric substrates of BGAs and printed wiring boards. In the case where integrated circuit elements are of silicon or ceramic, connected to a similar substrate, a ceramic core with low coefficient of thermal expansion, such as alumina, mullite or aluminum nitride is better matched.

The core structure 801 is coated, preferably by plating with two or more metal layers 802/803. The outer layer is a material which is readily wet by solder and resistant to environmental contamination, such as Au, Pd, Pt and Mo. From experience with leaded connections, a very thin layer, approximately 0.125 microns, of palladium (Pd) has been shown to provide a low cost, readily processed coating which is compatible not only with lead/tin solders, but with a number of nonleaded solders. A layer of Pd about 0.125 microns comprises the preferred outer coating 803 on the connecting structure of this invention.

Metals which are readily wet by solder are highly soluble and such is the case with palladium. During the reflow process, the palladium layer 803 will be dissolved in the solder and therefore it is necessary that said coating provide atmospheric protection for the next layer 802 so that the second metal coating can be wet with solder. Nickel is compatible with solder, but has much lower solubility and therefore will not be consumed if the thickness is controlled to approximately 2 microns. Additional metal layers are provided to insure adhesion to the core structure if necessary. While the invention has been shown and described with reference to the preferred embodiments, a number of alternate materials are applicable and would be preferred in different integrated circuit applications. TABLE 1 provides a listing of some alternate materials which are applicable, but the invention is in no way limited to these examples.

To summarize, a preferred embodiment of a composite bump structure for a integrated circuit package such as a BGA package comprises a prefabricated copper sphere about 0.9 mm in diameter with metal coatings of about 2 microns of nickel and 0.125 microns of palladium, attached to a contact pad by solder.

Figure 8:
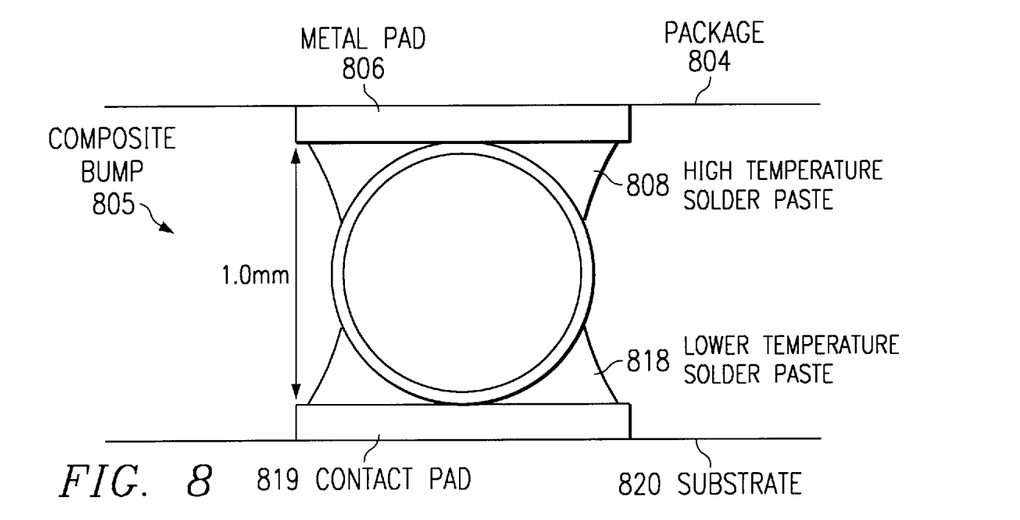
FIG. 8 depicts solder temperature hierarchy in assembly of integrated circuit elements.

Control of stand-off separation between the integrated circuit or package and substrate has been noted in the discussions above as an issue with bump connections. Prefabricated core structures of metal, ceramic or high glass transition plastics provide separation based on the design height of said structure and are not subject to change during the attachment process or as a function of package weight. In the preferred embodiment, FIG. 8 shows separation between the integrated circuit package 804 and next level of interconnect 820 is controlled at about 0.9 mm by the composite bump structure 805. Further, uniformity of bump size is achieved almost entirely by control of the core structure. Core structures are controlled at plus or minus about 5 to 10 percent of nominal. It should be noted that more rigid control is not required because as solder paste conforms to the bump and substrate, some height adjustment is achieved.

Shapes other than spheres have been fabricated in metal structures which are further suitable for connection structures. FIG. 9 depicts some alternate shapes and in particular the hour glass shape of 901 offers a stress relief design similar to previously disclosed column structures.

Further, FIG. 8 demonstrates a thermal hierarchy provided by this invention. Solder attachments are made to the composite bump structure 805. Solders 808 and 818 with different reflow temperatures are preferably used to make the connections at the integrated circuit or package 804 and at the next level of interconnection 820. Rework at the second level connection 820 is readily accomplished without disturbing the connection structure on the integrated circuit or package 804 if the reflow temperature of the solder 808 at the package has a higher liquidus temperature than that of solder 818 on the contact pad 819 of the second level interconnection 820. The preferred embodiment of this invention comprises a solder 808 with liquidus temperature higher than that of Sn/Pb eutectic solder. Eutectic solder 818 processing is assumed at the next level of interconnection 820 only because the manufacturing process is well established and the device of this invention will be compatible with that existing infrastructure.

A further object of this invention is to provide a lead (Pb) free integrated circuit device. The composite bump structure 805 of this invention with an outer coating such as Pd is compatible with lead (Pb) free solders. One such solder as Castin, 93–98%Sn/ 1.5–3.5%Ag /0.2–2% Cu/ 02.–2%Sb becomes liquidus in the range of 215 degC and provides a suitable solder for the preferred embodiment. Other lead (Pb) free solders, as well as lead (Pb) bearing solders are compatible with the composite bump structure 805.

Advantages of providing a lead (Pb) free connection structure are not limited to environmental issues, but in particular for bump structures which are located in close proximity to the active surface of an integrated circuit, such as flip-chip and some CSP, soft error failures from alpha particles are a concern. Leaded (Pb)solders are known to be a source of high alpha emission and it is an object of this invention to provide a connecting structure with lower alpha emission than is typical of lead (Pb)bearing solders. A composite bump structure of any of the materials discussed in this invention and in particular a polymer core attached by a lead (Pb) free solder such as Castin is a preferred connection structure for devices sensitive to alpha emission.

Further, density of lead (Pb) bearing connection structures contribute to package weight and to obscuring x-ray penetration which is used to inspect for defects in solder joints. Both of these factors support replacement of lead (Pb) containing connection structures by alternate materials.

In summary, a bump connection structure 800 for an integrated circuit or package of this invention is provided: a prefabricated core 801 largely defines the shape and size of the structure and its composition optimizes the thermal-mechanical match to the integrated circuit or package. The core 801 is coated with thin metallic layers 802/803 which are compatible with various solders and provide electrical contact by surrounding and adhering to the core. Further, the resulting composite bump structure 805 of core 801 with metal coatings 802/803 is connected to the integrated circuit element 804 by solder 808 which is preferably lead free and has higher liquidus temperature than eutectic solder.

Turning now to the method for forming the composite connection structure 800. A reliable, low cost process which is compatible with high volume manufacturing is provided. Composite bump structures 805 are provided by coating thin layers of metal 802/803 on prefabricated core structures 801. Metal coating 802/803 is preferably accomplished by plating and will be provided by those skilled in the art. Core structures 801 or those from FIG. 9 are commercially available from metal, plastic or ceramic manufacturers. The resulting composite structures are attached to input/output contact pads 806 of the integrated circuit or package 804 by the following steps: solder paste 808 is printed onto said contact pads 806 which have solder compatible surfaces through apertures in a stencil. Composite bump structures 805 are aligned to the contact pads 806 which have solder paste 808 applied, brought into contact and heat applied to form a metallurgical bond between solder 808 and said composite bump structures 805.

Figure 10:
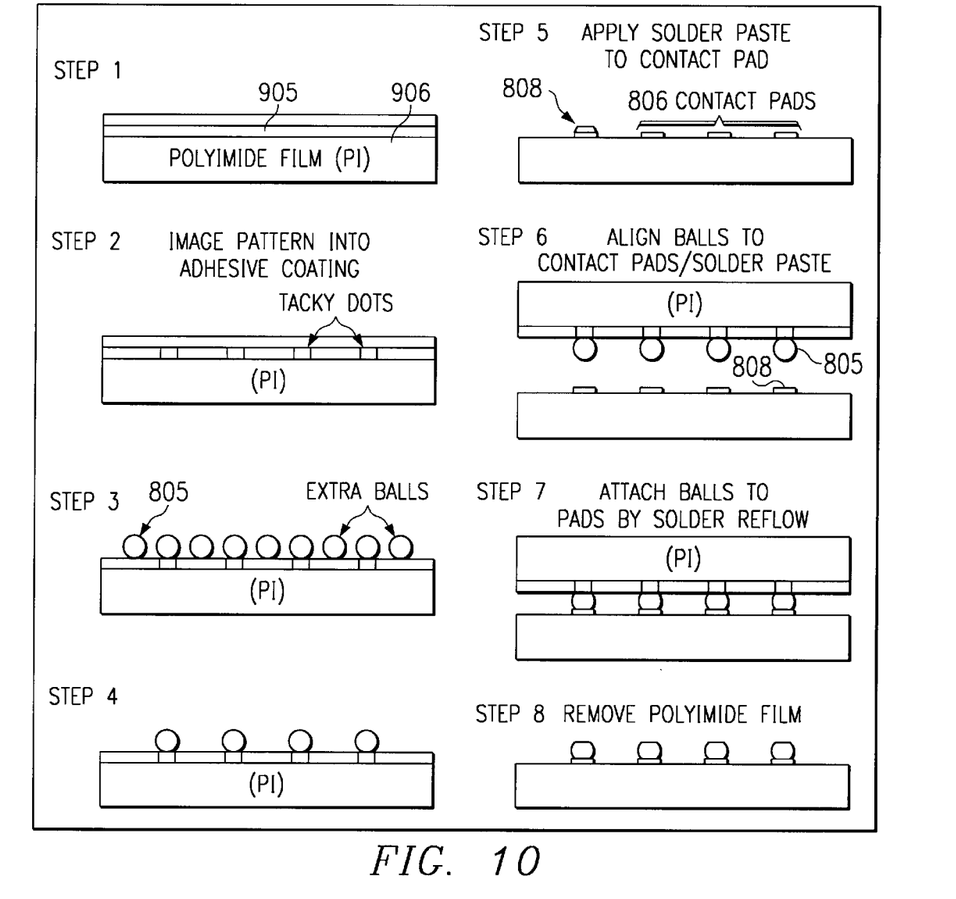
FIG. 10 depicts a process flow for assembly of bump connection structures from prefabricated composite bumps.
Figure 11A:
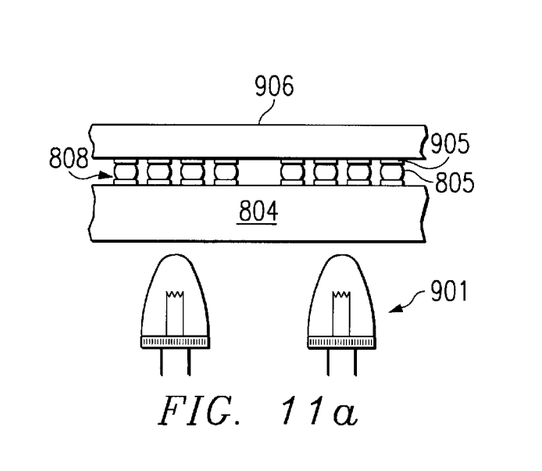
FIG. 11a illustrates a radiant heating process for transfer composite ball structures.
Figure 11B:
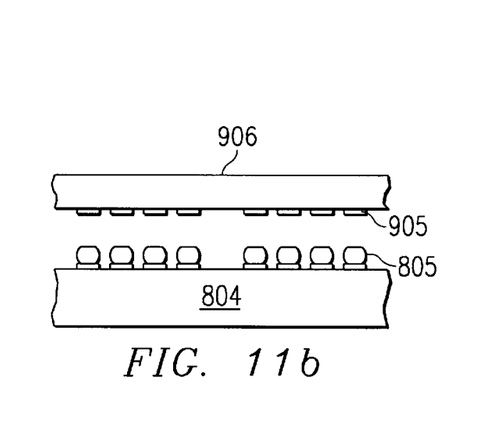
FIG. 11b illustrates an integrated circuit element with composite ball attached.

A flexible process is provided 10 for aligning and attaching the composite bump structures 805 to the contact pads 806. The process provides for forming and array of patterned areas which register to the locations of the contact pads. One bump structure is captured per patterned area and retained until they are aligned to the receiving pads. The preferred method for forming the patterned arrays and attaching to the contact pads is depicted in FIG. 10. In Step 1 there is provided a photopolymer adhesive coating on a 0.003 inch thick transparent polyimide film. In Step 2 an array of tacky or sticky areas is formed in the adhesive by placing a phototool over the coating and then exposing the coating to a dose of ultraviolet radiation. Those areas protected by the phototool remain tacky while those areas exposed to radiation lose their adhesiveness. The tacky areas register to the pattern of contact pads. In Step 3, a Mylar cover sheet is removed and an excess of composite bump structures which will form the connection device are loaded onto the film. One sphere is retained by each of the sticky areas as in Step 4 and excessive and unwanted bump structures are removed mechanically. Solder paste is applied to the contact pads through apertures in a screen (not shown) in Step 5. The populated film is aligned to the contact pads of the integrated circuit or package and lowered as shown in Step 6. Upon heating or exposure to ultraviolet light the adhesive loses tackiness and in the preferred embodiment, the bumps are captured in the hot solder paste as in Step 7. In Step 8, the polyimide film is removed from the assembly. Heating techniques for solder reflow are well known, and the preferred method referenced by this patent is illustrated in FIG. 11a and 11b. The polyimide film 906 with composite bumps 805 captured by photopolymer 905 is aligned to the contact pads as shown above. It makes use of a clean process by using radiant heat from lamps 901 to heat the substrate 804 which is the subject integrated circuit or package. Radiation is absorbed by the substrate 804 with solder paste 808. As shown in FIG. 11b, in the preferred embodiment, the photopolymer 905 crosslinks and allows transfer of the bump structure 805 from the polyimide 906 onto the substrate 804 and form a metallurgical bond with the solder 808. Process ramp time and temperature are controlled by a rheostat like device which is not shown.

A procedure to align and attach composite bump structures to an integrated circuit or package has been provided for the preferred embodiment of this invention, namely a BGA package, but is applicable to CSP or flip chip and further can be applied to individual integrated circuit elements or to full wafers.

While a preferred method for attaching composite bumps structures has been described, other techniques for transferring bumps to BGA packages have been demonstrated previously and will be obvious to those skilled in the art.

In summary, a bump connection structure for an integrated circuit or package of this invention is provided: a prefabricated core structure 801 defines the shape and size of the structure and its composition optimizes the thermal and mechanical match to said integrated circuit or package 804.

Thin metallic coatings 802/803 which are compatible with various solders and provide electrical contact surround and adhere to the core. Further, the resulting composite structure of core with metal coatings is connected to the integrated circuit element by solder paste on the contact pads which is preferably lead free and has higher liquidus temperature than eutectic solder.

It has further been shown a method to define a pattern which corresponds to the contact pads of said integrated circuit or package, capture a composite ball structure in each area, align to the contact pads to which solder paste has been applied, heat the assembly of substrate which allows the balls to be transferred to the solder paste and attached metallurgically to the integrated circuit or package. The method described herein is applicable to either type of integrated circuit or package and the various bump structures of this patent.

TABLE 1

Metal Coating Options for Composite Bump Structures

| Solderable Outermost Layer | Inner/Middle Layer | Adhesion/Inner Layer |
|---|---|---|
| Pd | Ni | Cu |
| Au | Ni | Cu |
| Pd | Ni | |
| Au | Ni | |
| Pd | Ni | Ti/W |
| Au | Ni | Ti/W |
| Pd | Ni/Cu | Cr |

What is claimed is:

1. A ball grid array integrated circuit package having bump connectors for attachment to the next level of assembly, each of said connectors comprising:
   a) a prefabricated core structure;
   b) at least two solder-compatible metal layer coatings on said core structure forming a composite bump, the outermost coating comprising a metal resistant to the environment and readily wet by solder, the next of said coatings comprising a metal having less solubility in solder than said outermost coating metal;
   c) a solder connection between said composite bump and the integrated circuit package.

2. A device as in claim 1 wherein the prefabricated core structure is comprised of metal having high thermal conductivity.

3. A device as in claim 1 wherein the metal coatings are in the range of 1.9 to 3 microns thickness.

4. A device as in claim 1 wherein the composite bump structure is between 0.5 and 1.0 mm in diameter, and in turn provides spacing between said package and the next level of interconnection in the range of 0.5 to 1.0 mm.

5. A device as in claim 1 wherein the bumped connection structure is lead (Pb) free.

6. A device as in claim 1 wherein said solder connection comprises a high liquidus temperature solder, whereby the connection will remain secure during subsequent eutectic solder processing.

7. A package as in claim 1 wherein said outermost coating is selected from gold, palladium, platinum, and molybdenum; and said less soluble coating comprises nickel.

8. A ball grid array package with bump connectors which allows attachment to the next level of interconnection, each of said connectors comprising:
   a) a prefabricated core structure;
   b) a solder compatible metal coating on said core structure, forming a composite bump;
   c) a solder connection between said composite bump and the integrated circuit package;
   d) said prefabricated core structure is a metal having a high thermal conductivity, or a polymer having low Young's modulus and high glass transition temperature, or a ceramic having a low coefficient of thermal expansion;
   f) a composite bump structure approximately 0.5 to 1.0 mm in diameter, with uniformity of 5 to 10 percent and assuring stand-off separation of said package to the next level of interconnection of about 0.5 to 1.0 mm;
   g) the metal coatings are in the range of 1.9 to 2.5 microns in thickness;
   h) said connection structure is lead (Pb) free, and
   i) said connection comprises a high liquidus temperature solder, whereby the connection will remain secure through eutectic solder processing.

9. A chip scale integrated circuit package having bump connectors for attachment to the next level of assembly, each of said connectors comprising:
   a) a prefabricated core structure having a size and composition suitable to provide the stand-off height required for chip scale packages;
   b) at least two solder-compatible metal layer coatings on said core structure forming composite bump, the outermost coating comprising a metal resistant to the environment and readily wet by solder, the next of said coatings comprising a metal having less solubility in solder than said outermost coating metal;
   c) a solder connection between said composite bump and the integrated circuit package.

10. A device as in claim 9 wherein the prefabricated core structure is comprised of a metal having a high thermal conductivity.

11. A device as in claim 9 wherein the metal coatings are in the range of 1.9 to 2.5 microns thickness.

12. Device as in claim 9 wherein the diameter of the composite bump structures is in the range of about 200 to 400 microns in diameter, thereby assuring spacing of about 200 to 400 microns between said chip scale package and the next level of interconnection.

13. A device as in claim 9 wherein the bumped connection structure is lead (Pb) free.

14. A device as in claim 9 wherein said solder connector comprises a high liquidus temperature solder, whereby the connection will remain secure during subsequent eutectic solder processing.

15. A package as in claim 9 wherein said outermost coating is selected from gold, palladium, platinum, and molybdenum; and said less soluble coating comprises nickel.

16. A chip scale package with bump connectors which allows attachment to the next level of interconnection, each of said connectors comprising:
   a) a prefabricated core structure;
   b) a solder compatible metal layer coating on said core structure, forming a composite bump;
   c) a solder connection between said composite bump and the integrated circuit package;
   d) a metal prefabricated core structure having a high thermal conductivity, or a polymer having low Young's modulus and high glass transition temperature or a ceramic having a low coefficient of thermal expansion;
   f) a composite bump structure approximately 200 to 400 microns in diameter having uniformity of 5 to 10 percent, thereby assuring stand-off separation of about 200 to 400 microns between said package and the next level of interconnection;
   g) said metal coatings are in the range of 1.9 to 2.5 microns in thickness;
   h) said connection structure is lead (Pb) free, and
   i) said connector comprises a high liquidus temperature solder, whereby the connection will remain secure through subsequent eutectic solder processing.

17. An integrated circuit chip having bump connectors for attachment to the next level of assembly, each of said connectors comprising:
   a) a prefabricated core structure having a size and composition suitable to provide the stand-off height required for chip scale packages;
   b) at least two solder-compatible metal layer coatings on said core structure forming a composite bump, the outermost coating comprising a metal resistant to the environment and readily wet by solder, the next of said coatings comprising a metal having less solubility in solder than said outermost coating metal;
   c) a solder connection between said composite bump and the integrated circuit chip.

18. A device as in claim 17 wherein the prefabricated core structure is comprised of a metal having high thermal conductivity.

19. A device in claim 17 wherein the metal coatings are in the range of 1.9 to 2.5 microns thickness.

20. A device as in claim 17 wherein the composite bump is about 80 to 200 microns in diameter, thereby providing spacing of about 80 to 200 microns between said integrated circuit and the next level of interconnection.

21. A device as in claim 17 wherein the bumped connection structure is lead (Pb) free.

22. A device as in claim 17 wherein the connector comprises a high liquidus temperature solder, whereby the connection will remain secure during subsequent eutectic solder processing.

23. A chip as in claim 17 wherein said outermost coating is selected from gold, palladium, platinum, and molybdenum; and said less soluble coating comprises nickel.

24. An integrated circuit having bump connectors to form a flip chip assembly which allows attachment to the next level of interconnection, each of said connectors comprising:
   a) a prefabricated core structure;
   b) a solder compatible metal layer coating on said core structure, thereby forming a composite bump;
   c) a solder connection between said composite bump and the integrated circuit;
   d) said prefabricated core structure comprises a metal having a high thermal conductivity, a polymer having a low Young's modulus and a high glass transition temperature, or a ceramic having a low coefficient of thermal expansion;
   f) a composite bump structure of approximately 80 to 200 microns in diameter having uniformity between balls of 5 to 10 percent, wherein the diameter of said structure conforms to the contact pad size and spacing provided on said integrated circuit, and whereby said structure assures a stand-off separation between the chip and the next level of interconnection of about 80 to 200 microns;
   g) the metal coatings are in the range of 1.9 to 2.5 microns in thickness, and
   h) said connection structure is lead (Pb) free.

* * * * *